(12) United States Patent
Fanic (10) Patent No.: US 8,179,651 B2
(45) Date of Patent: *May 15, 2012

(54) OVERLOAD PROTECTION FOR A CIRCUIT ARRANGEMENT HAVING A TRANSISTOR

(75) Inventor: Petar Fanic, Villach (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

This patent is subject to a terminal disclaimer.

(21) Appl. No.: 13/040,383

(22) Filed: Mar. 4, 2011

(65) Prior Publication Data

US 2011/0148476 A1    Jun. 23, 2011

Related U.S. Application Data

(63) Continuation of application No. 12/241,877, filed on Sep. 30, 2008, now Pat. No. 7,907,379.

(51) Int. Cl.
*H02H 9/02* (2006.01)

(52) U.S. Cl. ...................................... 361/93.9; 361/93.7

(58) Field of Classification Search ......... 361/93.7–93.9
See application file for complete search history.

(56) References Cited

U.S. PATENT DOCUMENTS

| | | | |
|---|---|---|---|
| 5,119,265 A | 6/1992 | Qualich et al. | |
| 5,465,190 A * | 11/1995 | Meunier et al. | 361/91.5 |
| 5,550,702 A | 8/1996 | Schmidt et al. | |
| 6,288,883 B1 * | 9/2001 | Chen | 361/58 |
| 6,366,153 B1 | 4/2002 | Arslain et al. | |
| 6,987,655 B2 | 1/2006 | Kesler et al. | |
| 7,907,379 B2 * | 3/2011 | Fanic | 361/93.9 |
| 2003/0072120 A1 | 4/2003 | Ishikawa et al. | |

* cited by examiner

*Primary Examiner* — Danny Nguyen
(74) *Attorney, Agent, or Firm* — Slater & Matsil, L.L.P.

(57) ABSTRACT

In an embodiment, a drive circuit for a transistor includes an output for providing a drive signal to the transistor. The drive circuit monitors the transistor for an occurrence of an overload, changes into an overload protection state in which the drive circuit drives the transistor in an ON state upon detection of the overload of the transistor. The drive circuit further changes into a voltage limiting state in which a voltage of the transistor is limited.

22 Claims, 7 Drawing Sheets

OVERLOAD PROTECTION FOR A CIRCUIT ARRANGEMENT HAVING A TRANSISTOR

This is a continuation application of U.S. application Ser. No. 12/241,877, entitled "Overload Protection for a Circuit Arrangement Having a Transistor," which was filed on Sep. 30, 2008 now U.S. Pat. No. 7,907,379, and is hereby incorporated herein by reference in its entirety.

BACKGROUND

Transistors, in particular power transistors such as power MOSFETs or power IGBTs, can be used as switches for switching electrical loads. Such loads may be inductive loads such as electric motors or solenoid valves. When the transistor is driven in the ON state, inductive loads absorb electrical energy, which must be commutated via a turn-off commutation circuit when the transistor is driven in the OFF state.

The transistor itself can be part of a turn-off commutation circuit that is used to convert the electrical energy stored in the load into heat. A semiconductor substrate or semiconductor chip in which the transistor is integrated heats up during load turn-off commutation. In this case, a critical operating state should be prevented in which there is a risk of damaging or destroying the transistor.

The thermal power that a transistor can absorb without reaching a critical operating state depends on various parameters such as the chip area or the existence of special cooling measures such as heat sinks. Power-transistor datasheets contain maximum values, which should not be exceeded, for power dissipation, turn-off commutation energy, permitted current, inductance to be switched or duty cycle. Whether the customer actually heeds this specification, however, is outside the control of the power transistor manufacturer.

SUMMARY

One aspect of this description relates to a drive circuit for a transistor, said circuit comprising an output for providing a drive signal for the transistor, and being designed to monitor the transistor for the occurrence of an overload, and being designed to assume an overload protection state in which it drives the transistor in the ON state if it detects an overload of the transistor.

A further aspect relates to a method for driving a transistor that has a load path and a drive terminal, where the method comprises: detecting an overload of the transistor; operating the transistor in an overload protection state in which the transistor is driven in the ON state if an overload is detected.

A further aspect relates to a circuit arrangement, which comprises: a transistor having a drive terminal and a load path; a drive circuit having an output, which is connected to the drive terminal of the transistor, the drive circuit being designed to monitor the transistor for the occurrence of an overload, and being designed to assume an overload protection state in which it drives the transistor in the ON state if it detects an overload of the transistor.

BRIEF DESCRIPTION OF THE DRAWINGS

Examples are described below with reference to figures. The description focuses on explaining the basic principle. The figures hence only show those components and signals needed to explain this basic principle. Unless stated otherwise, in the figures, the same references denote identical components having the same relevance.

DETAILED DESCRIPTION

Figure 1:
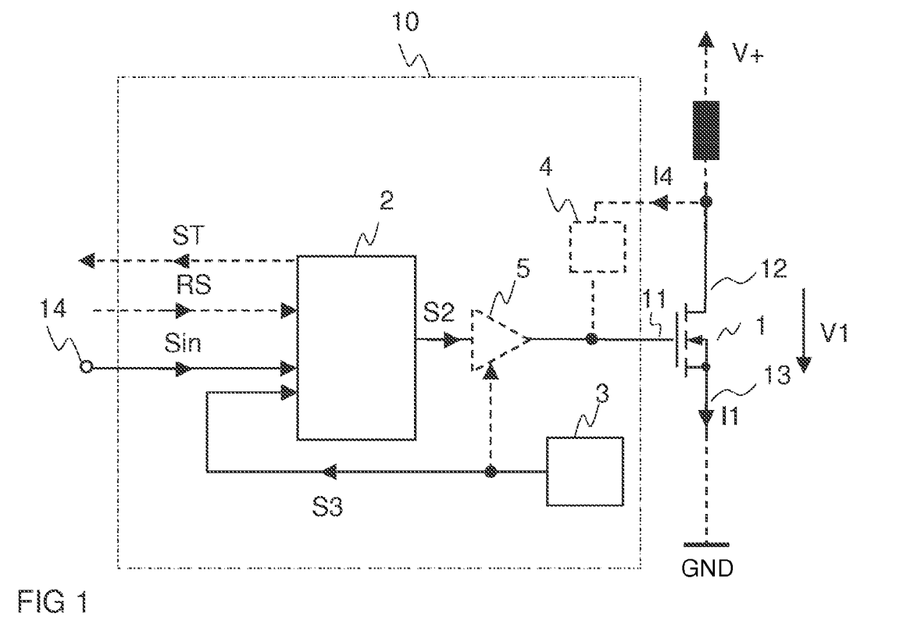
FIG. 1 shows in a block diagram a circuit arrangement having a transistor and a drive circuit for the transistor.

FIG. 1 shows an example of a drive circuit 10 for a transistor. FIG. 1 also shows a transistor 1 driven by this drive circuit 10 in order to aid understanding of how this drive circuit 10 works. The transistor 1 comprises a drive terminal 11 and first and second load-path terminals 12, 13, between which runs a load path. The transistor is a MOSFET, for example, in particular a power MOSFET, which has a gate terminal as the drive terminal 11, and drain and source terminals as the first and second load-path terminals. The transistor 1 shown in FIG. 1 for explanatory purposes is a normally-off n-channel MOSFET. It should be mentioned that using such a MOSFET as transistor 1 should be considered merely as an example, and that any other types of MOS transistors such as p-channel MOSFETs or IGBTs, or even bipolar transistors, can obviously be used.

The circuit arrangement comprising the transistor 1 and the drive circuit 10 can be used to switch an electrical load. In this case, the load path 12-13 of the transistor 1 is connected in series with the load between terminals for first and second supply potentials or positive and negative supply terminals. Such a load Z connected in series with the load path 12-13 of the transistor 1 is also shown in FIG. 1 as a further aid to explanation. In FIG. 1, GND denotes a reference potential and V+ denotes a positive supply potential or a supply voltage referred to as reference potential GND. In the example shown, the load Z is connected between the transistor 1 and a terminal for a positive supply potential V+, and the transistor 1 is connected up as a "low-side switch". This is to be understood merely as an example. The basic principle explained below of a drive of the transistor 1 also applies accordingly to "high-side switches" for which the load is connected between the transistor and a terminal for a negative supply potential or reference potential.

In order to switch on the load Z, the drive circuit 10 drives the transistor 1 in the ON state, and in order to switch off the load, the drive circuit 10 drives the transistor 1 in the OFF state. The transistor 1 is driven in the ON and OFF state during normal operation of the drive circuit 10 under the control of a switching signal Sin, which is supplied to an input 14 of the drive circuit 10. This switching signal Sin can be generated by a central control circuit (not shown in greater detail), such as a microcontroller.

The drive circuit 10 comprises a drive-signal generating circuit 2 and an overload detector 3. The overload detector 3, which is shown schematically in FIG. 1, is designed to detect an overload of the transistor 1 and to generate an overload signal S3. The overload signal S3 has a signal level that depends on whether such an overload of the transistor 1 exists. The overload signal S3 is a two-level signal, for example, which assumes a first signal level, also referred to below as an overload level, when an overload of the transistor 1 is detected, and which otherwise assumes a second signal level. The drive-signal generating circuit 2, for example, can be a microcontroller or part of a microcontroller. The transistor 1 is integrated in a semiconductor substrate or semiconductor chip in a manner not shown in greater detail here. The overload detector 3 can also be integrated in the same semiconductor chip as the transistor 1. There is also the option, however, of integrating the overload detector 3 in a separate semiconductor chip which, in chip-on-chip technology, is arranged on the semiconductor chip of the transistor 1, or, in chip-by-chip technology, beside the semiconductor chip of the transistor 1.

An overload of the transistor 1 exists when the transistor 1 is in a critical operating state or when such a critical operating state will be reached imminently. A critical operating state exists, for example, when a temperature of the transistor 1 or of a semiconductor substrate (not shown) in which the transistor 1 is integrated reaches a critical temperature. This critical temperature is chosen so that it lies below a temperature at, or above, which there is the imminent risk of transistor 1 being damaged or destroyed.

Such an overload of the transistor 1 can be detected in various ways, for instance by: measuring the temperature of the transistor 1 or of the semiconductor substrate; measuring the electrical energy converted into heat in the transistor 1 during a defined time window; measuring the electrical power converted into heat in the transistor 1; when driving an inductive load, measuring a time period during which turn-off commutation of the load occurs; etc.

The overload signal S3, which is provided by the overload detector 3 and which indicates an overload of the transistor 1, and a switching signal Sin are input to the drive-signal generating circuit 2, which, depending on these signals, generates a drive signal S2, which is fed to the drive terminal 11 of the transistor 1. The drive-signal generating circuit 2 can be a logic circuit, and the drive signal S2 can accordingly be a logic signal, which assumes signal levels between 0V and 5V or 0V and 3V, depending on the technology. A driver circuit 5 (shown dashed in FIG. 1) is optionally provided to convert such logic signal levels to signal levels suitable to drive the transistor 1, said driver circuit being connected between the drive-signal generating circuit 2 and the drive terminal 11 of the transistor 1.

It should be assumed for the explanation below that the drive signal S2 is a two-level signal, which can assume an ON level and an OFF level, and that the transistor 1 is driven in the fully ON state for an ON level of the drive signal S2. The degree to which the MOSFET 1, provided as the transistor in the example shown, is turned on is a function of a gate-source voltage lying between its gate terminal 11 and its source terminal 13. The MOSFET 1 is driven in the fully ON state when this gate-source voltage is significantly higher than a threshold voltage of the MOSFET, for instance when the gate-source voltage equals 5 to 10 times the threshold voltage. The threshold voltage lies approximately in the range 2V to 3V for a silicon-based MOSFET.

Figure 2:
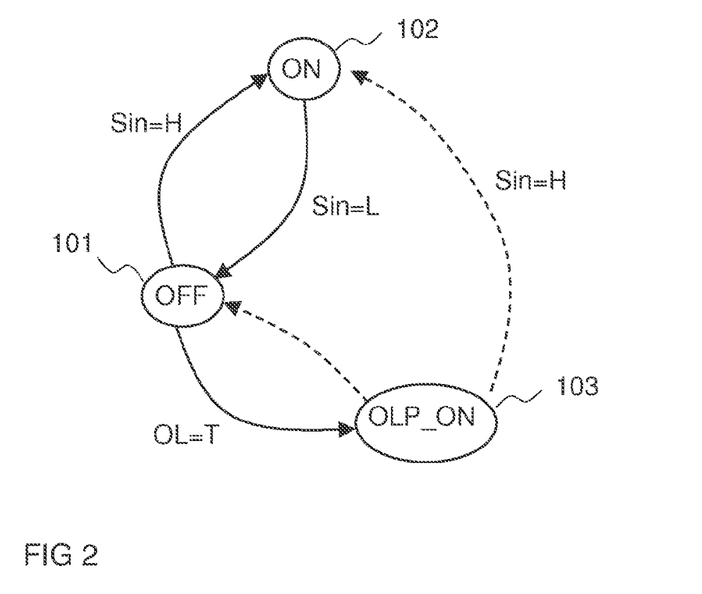
FIG. 2 uses a state diagram to show how a first example of the drive circuit works.

Referring to FIG. 2, which shows a state diagram for the drive circuit 10, the drive circuit 10 can assume at least three different operating states: an OFF state 101, in which the switching signal Sin and the drive signal S2 each have an OFF level: an ON state 102, in which the switching signal Sin and the drive signal S2 each have an ON level: and an overload protection state 103, in which the drive signal S2 assumes an ON level irrespective of the switching signal Sin in order to drive the transistor 1 in the ON state. In FIG. 1 and in subsequent figures, Sin=H stands for an ON level and Sin=L stands for an OFF level of the switching signal Sin. The drive circuit 10 changes into the overload protection state 103 if there is an overload of the transistor 1. In FIG. 1 and in subsequent figures, OL=T stands for a detected overload (OL for overload, T for True).

In the ON state 102 and in the overload protection state 103, the transistor 1 is driven in the ON state in the same manner. From the outside, i.e. as regards a load current I1 flowing through the load Z and the transistor 1, there is no difference between these two operating states 102, 103. In the overload protection state 103, however, the transistor 1 is driven in the ON state irrespective of the switching signal Sin and, by driving the transistor 1 in the ON state, is done with the aim of preventing the transistor reaching a critical operating state or of getting the transistor to leave such a critical operating state again in order to prevent potential damage or destruction of the transistor 1, as will be explained further below.

If the drive circuit 10 is in the OFF state, i.e. if the drive signal S2 has an OFF level, there is the risk of a critical operating state, for example when the transistor 1 goes into avalanche mode. This transition into avalanche mode of the transistor 1 can be caused by an inductive load Z, for example, in which such a high voltage is induced after switching off the transistor 1 that a voltage V1 across the load path of the transistor 1 rises to its avalanche breakdown voltage, so that the transistor 1 goes into avalanche. The resistance of the load path of the transistor 1 is significantly higher in avalanche mode than the conducting-state resistance when it is driven in the ON state, so that the temperature of the transistor 1 can rise in avalanche mode. How far the temperature rises depends, for example, on how much energy was previously stored in the inductive load Z.

A voltage limiting circuit 4, also known as a turn-off commutation circuit or clamping circuit, may also be the source of the risk of the transistor 1 attaining a critical operating state. Such a voltage limiting circuit is optionally present and is shown dashed in FIG. 1 and denoted by the reference 4. This voltage limiting circuit 4 is designed to place an upper limit on a load-path voltage V1 lying across the load path 12-13 by driving on the transistor 1 when the drive signal S2 has an OFF level. The voltage at which the voltage limiting circuit 4 limits the voltage between the first load-path terminal and the drive terminal is referred to below as the clamping voltage. In the example shown, the voltage limiting circuit 4 is connected between the load-path terminal facing the load Z (drain terminal) 12 of the transistor 1 and the drive terminal 11. The electrical potential at this load-path terminal 12 in this case equals the load-path voltage V1. A circuit of this type, which is shown in FIG. 1 for an n-channel MOSFET connected as a low-side switch, also applies (though not shown) to an n-channel MOSFET as a high-side switch or to a p-channel MOSFET whether as a low-side switch or high-side switch.

The voltage limiting arrangement 4 together with the transistor 1 forms a control circuit. In this control circuit, the transistor is driven on by the voltage limiting circuit 4 to such an extent that the load-path voltage V1 does not rise above a defined voltage threshold. In a manner that is not shown further, a rectifier element can be connected between the drive-signal generating circuit 2 or the driver circuit 5 and the voltage limiting circuit 4, which prevents a current that is flowing via the voltage limiting circuit 4 from flowing away through the drive-signal generating circuit 2 or the driver circuit 5 respectively.

Figure 3:
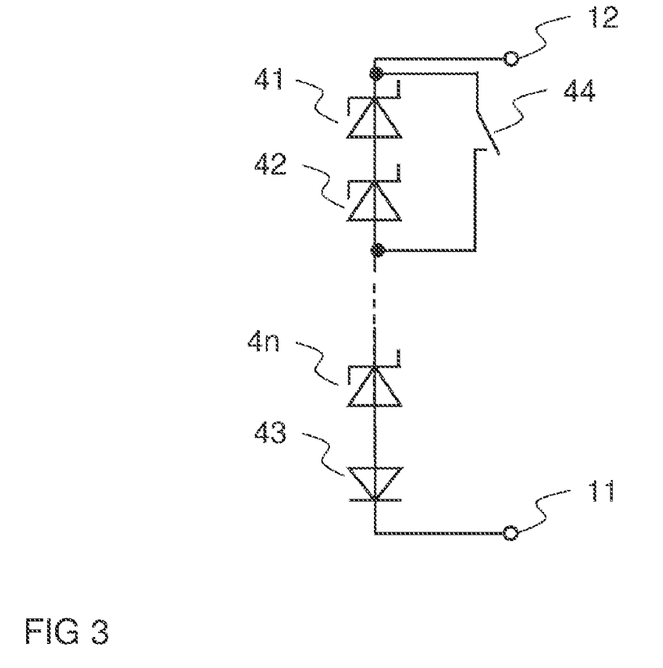
FIG. 3 shows an example implementation of a voltage limiting circuit of the drive circuit.

FIG. 3 shows an example of such a voltage limiting arrangement 4. This voltage limiting arrangement comprises one or more voltage limiting elements 41, 42, 4n, which are connected between the first load-path terminal 12 and the drive terminal 11. In the example shown, these voltage limiting elements are Zener diodes 41, 42, 4n, which are connected in the reverse direction between the load-path terminal 12 and the drive terminal 11. A rectifier element, in the example a diode, is also connected in the reverse direction between the drive terminal 11 and a load-path terminal 12, which prevents the drive potential at the drive terminal 11 from following the electrical potential at the first load-path terminal 12 when the transistor 1 is driven in the ON state.

How such a voltage limiting circuit or turn-off commutation circuit 4 works is explained below for the case where the load Z is an inductive load. An inductive load Z stores electrical energy when the transistor 1 is driven in the ON state. After driving transistor 1 in the OFF state, i.e. in the OFF state of the drive circuit 10, the voltage limiting circuit 4 allows turn-off commutation of the inductive load. In this case, the transistor is only driven on to the extent that the load-path voltage V1 does not rise above the defined load-path threshold value, in other words its conducting-state resistance is significantly higher than the conducting-state resistance when the transistor is driven in the fully ON state. The temperature of the transistor 1 rises during such a turn-off commutation of an inductive load, creating the risk that the transistor 1 attains a critical operating state.

The electrical energy stored in the inductive load Z is converted into heat in the transistor 1 during this turn-off commutation process. The thermal power that the transistor 1 must absorb in this case depends on several factors including the inductance of the inductive load Z and the length of time during which the load has previously absorbed electrical energy when the transistor 1 is driven in the ON state. If the load Z is driven in switched mode, then the thermal power to be absorbed by the transistor 1 in the OFF state of the drive circuit depends directly on the duty cycle of the switched drive.

Driving the transistor 1 in the ON state 102 and in the over-temperature protection state 103 on the one hand, and during a turn-off commutation of an inductive load on the other, differ in terms of the conducting-state resistance of the transistor 1 as explained. The transistor 1 is driven during the former states 102, 103 with the aim of driving the transistor 1 in the fully ON state, i.e. of operating the transistor 1 with the minimum possible conducting-state resistance. The drive signal S2 has a suitable drive level for this purpose, which is further amplified, if applicable, by the optionally present driver circuit 5. During a turn-off commutation phase, on the other hand, the transistor 1 is driven with the aim of limiting the load-path voltage V1 to such an extent that damaging or destroying the transistor 1 is avoided, but that a conducting-state resistance of the transistor 1 is so high that the load turns off as quickly as possible, i.e. that the energy stored in the load is converted into heat as quickly as possible.

In one example it is provided to use a different drive voltage to drive the transistor 1 into the overload protection state 103 than when switching on in the ON state 102. The drive circuit 2 or the driver circuit 5, to which the overload signal S3 is optionally input, is in this case designed to set the signal level of the drive signal S2 according to the signal level of the overload signal S3.

In a further example it is provided to set a clamping voltage according to the signal level of the overload signal S3, with an optionally present voltage limiting circuit 4 limiting the voltage between the first load-path terminal 12 and the drive terminal 11 to this clamping voltage, and to set this clamping voltage of the transistor 1 so that it is lower in the overload protection state 103 than in the ON state 102, for example. The overload signal S3 is input to the voltage limiting circuit 4 for this purpose.

In a voltage limiting circuit 4 as shown in FIG. 3, such a reduction in the clamping voltage can be achieved, for example, by a switch 44, which is connected in parallel with one or more of the Zener diodes 41-4n, and which is driven by the overload signal S3. If the overload signal S3 has an overload level, the switch bypasses the one or more Zener diodes across which it is connected in parallel, thereby reducing the clamping voltage. The overload protection state 103 constitutes a safeguard that is intended to prevent damage or even destruction of the transistor 1. The overload detector is designed to detect an overload of the transistor 1, for which the drive circuit 2 goes into the overload protection state 103, even before the transistor 1 reaches a critical operating state. Such a critical operating state, for example, might be attained if the transistor 1 is used for switching inductive loads for which it is not specified. These are loads, for example, that absorb more electrical energy when the transistor 1 is in the ON state than can subsequently be converted into heat in the transistor 1 without it being damaged.

In the event of such an overload, switching on the load Z is preferred to destroying the transistor 1. In this case, the load Z can no longer be switched via the switching signal Sin. An excessive rise in the load current can be prevented in this case by additional safeguards (not shown), such as fuses in the load circuit.

A load that is permanently or at least temporarily incapable of being switched is a fundamentally undesirable operating state. In comparison to this, however, if a transistor is overloaded so that its temperature rises to the level of a damaging or destructive temperature, then the load path of the transistor can be short-circuited. In this respect, the overload protection state 103 does not differ from a fault state that arises with a damaged or destroyed transistor, but does differ in that where a transistor is damaged or destroyed, because of the critical operating state, there is also a risk to other circuit components of a circuit in which the circuit arrangement containing the transistor and the drive circuit is used. The drive circuit 10 can be designed to remain, after going into the first temperature protection state, permanently in this overload protection state 103. The drive circuit 10, however, can also be designed to leave the overload protection state again under certain conditions and to go into the OFF state 101 or the ON state 102 (shown dashed in FIG. 2), for example, which will be explained further below.

An overload of the transistor 1 can be detected in a variety of ways, in other words from different operating parameters. It should be pointed out in this context that in this description, an overload of the transistor exists when one or more operating parameters indicate that there is the risk of the transistor 1 attaining a critical operating state. Suitable operating parameters for detecting such an overload, for example, are the temperature of the transistor, an amount of electrical energy converted into heat in the transistor, the current flowing during a turn-off commutation or a turn-off commutation period. Exemplary embodiments of the overload detector 3, which generates the overload signal S3, are described below.

Figure 4:
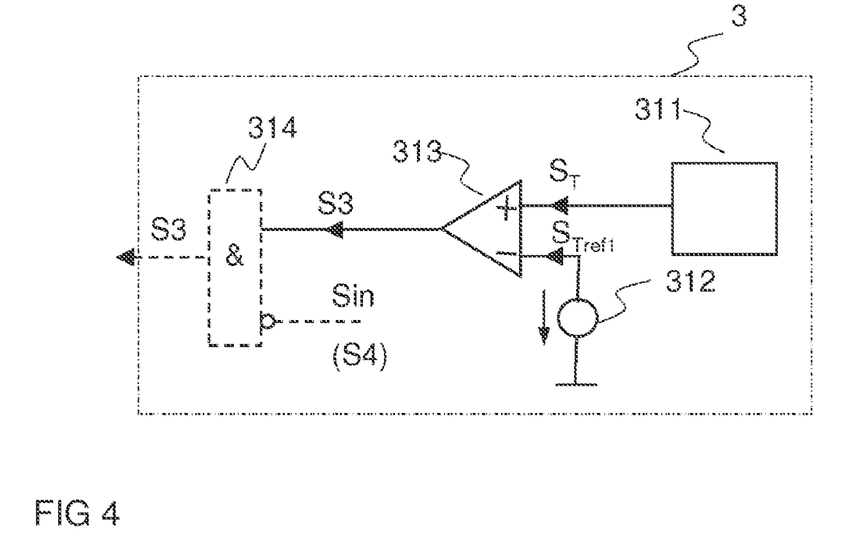
FIG. 4 shows a first example of an overload detector of the drive circuit.

In a first example it is provided for detecting an overload of the transistor 1 to determine and evaluate a temperature of the transistor 1. An overload level of the overload signal S3 is generated in this case when this temperature exceeds a defined first threshold value Tref1. FIG. 4 shows an overload detector 3 having this functionality.

This overload detector 3 comprises a temperature sensor 311, which generates a temperature signal or temperature measurement signal $S_T$ representing the temperature of the transistor, and a reference-signal source 312, which provides a reference signal $S_{Tref1}$ representing the first temperature threshold value Tref1. The temperature signal $S_T$ and the reference signal $S_{Tref1}$ are input to a comparator 313, which compares these two values and which has an output at which the overload signal S3 is provided. The comparator 313 is designed to generate an overload level of the overload signal S3 when the temperature signal $S_T$ indicates that the temperature of the transistor 1 lies above the threshold value represented by the reference signal $S_{Tref1}$. In the example shown in FIG. 4, this is the case when the temperature signal $S_T$ exceeds the reference signal $S_{Tref1}$.

In a second example it is provided that the electrical energy converted into heat in the transistor during a defined time window is measured and compared with an energy threshold value Eref. In this case, an overload level of the overload signal S3 is generated when this energy exceeds the energy threshold value Eref.

Figure 5:
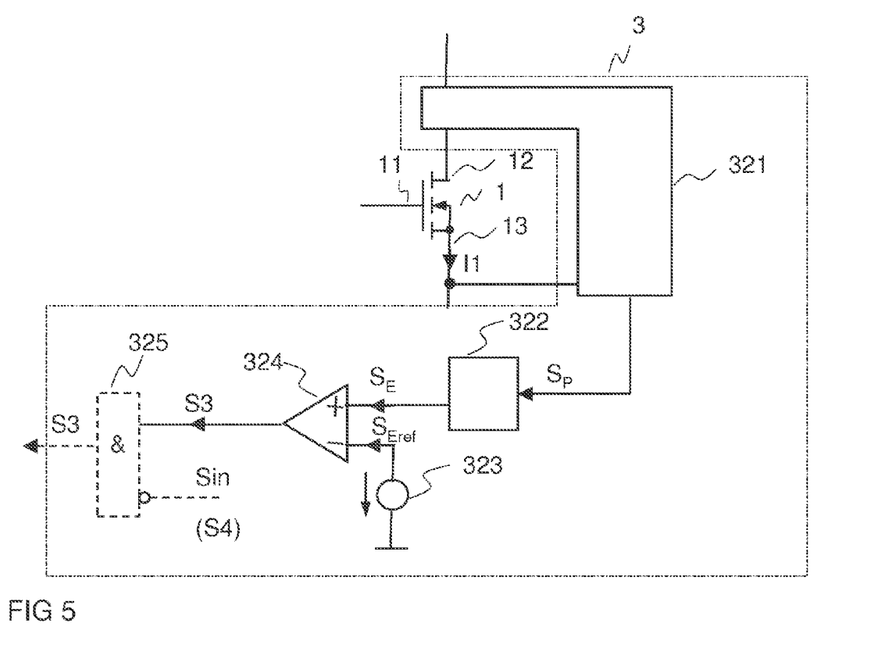
FIG. 5 shows a second example of an overload detector of the drive circuit.

FIG. 5 shows an overload detector 3 having this functionality. This overload detector 3 comprises a power sensor 321, which is connected to the load path of the transistor 1 and which is designed to generate a power signal or power measurement signal $S_P$ that represents an instantaneous value of the electrical power converted into heat in the transistor 1. The power sensor comprises in a manner not shown in further detail, for example, a voltage measuring arrangement for measuring a voltage across the load path of the transistor 1, a current measuring arrangement for measuring a current through the load path, and a multiplier, which multiplies the measurement signals generated by the voltage measuring arrangement and the current measuring arrangement to generate the power signal $S_P$.

The power signal $S_P$ is input to an integrator 322, which is designed to integrate the power signal $S_P$ over a defined time window, which can be a moving time window, and to provide an energy signal $S_E$. This energy signal $S_E$ represents the electrical energy converted into heat in the transistor 1 during the time window. The overload detector 3 also comprises a reference-signal source 323, which provides a reference signal $S_{Eref}$ representing the energy threshold value Eref. The energy signal $S_E$ and the reference signal $S_{Eref}$ are input to a comparator 324, which compares these two values and which has an output at which the overload signal S3 is provided. The comparator 324 is designed to generate an overload level of the overload signal S3 when the energy signal $S_E$ indicates that the electrical energy converted into heat in the transistor 1 during the time window lies above the threshold value Eref represented by the reference signal $S_{Eref}$. In the example shown in FIG. 5, this is the case when the energy signal $S_E$ exceeds the reference signal $S_{Eref}$.

In a third example it is provided to evaluate the load current of the transistor 1 during the OFF state 101. As already explained, a current can flow in this state when the transistor 1 is in avalanche mode or when a voltage limiting circuit 4 is provided, which drives the transistor on in order to commutate the load when it is turned off. If this load current exceeds a defined load-current threshold value Iref during the OFF state 101 then an overload exists.

Figure 6:
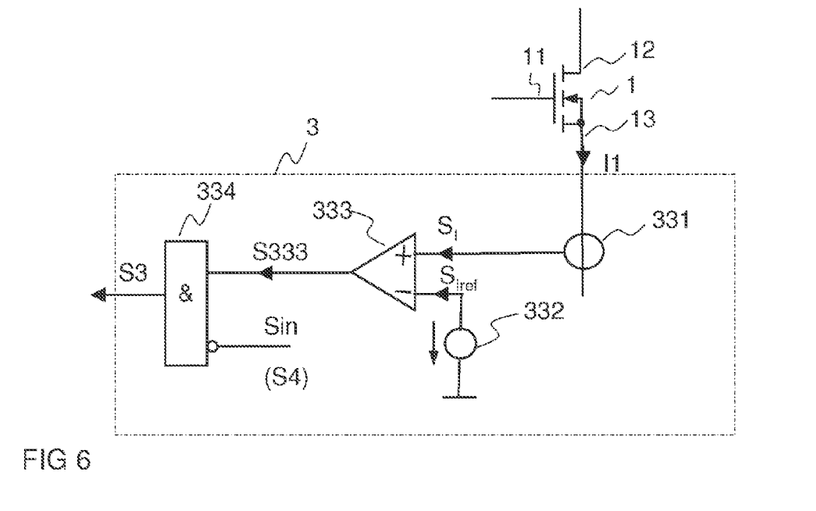
FIG. 6 shows a third example of an overload detector of the drive circuit.

FIG. 6 shows an overload detector 3 that has this functionality to detect the load current I1 during the OFF state 101. This overload detector 3 comprises a current sensor 331, which is designed to generate a current signal or current measuring signal $S_I$ that represents a load current I1 flowing through the load path of the transistor 1. This current sensor can be any current sensor, in particular also a sensor that works on the "current-sense" principle.

The overload detector 3 also comprises a reference-signal source 332, which provides a reference signal $S_{Iref}$ representing the current threshold value Iref. The current signal $S_I$ and the reference signal $S_{Iref}$ are input to a comparator 333, which compares these two values and which has an output at which a comparison signal S333 is provided. The comparator 333 is designed to generate such a signal level of the comparison signal S333 that corresponds to an overload level of the overload signal S3 when the current signal $S_I$ indicates that the current flowing in the transistor 1 is greater than the current threshold value $S_{Iref}$. In the example shown in FIG. 5, this is the case when the current signal $S_I$ exceeds the reference signal $S_{Iref}$.

In the overload detector shown in FIG. 6, the overload signal S3 is provided at the output of an AND gate 334, to which is input the comparison signal S333 and which is designed to output the comparison signal S333 as the overload signal S3 during the OFF state 101, and otherwise to set the level of the overload signal S3 to the second signal level, which indicates a non-overload. This ensures that a load current I1 exceeding the reference value Iref only results in an overload level of the overload signal S3 during the OFF state. In the example, this is done by taking the switching signal Sin to an inverting input of the AND gate 334. A low-level of the switching signal here represents the OFF state 101.

Instead of the inverting switching signal Sin, a voltage limiting signal S4 can also be input to the AND gate 334, which indicates whether the transistor 1 is in a voltage limiting mode. Referring to the previously explained examples, such a voltage limiting mode is either an avalanche mode or a mode in which voltage limiting circuit 4 is enabled, if such a voltage limiting circuit 4 is present. The AND gate 334 enables generation of an overload level of the overload signal S3 in this case only when the voltage limiting signal S4 indicates a voltage limiting mode of the transistor 1. As explained, such a voltage limiting mode can only occur during the OFF state 101.

Figure 7:
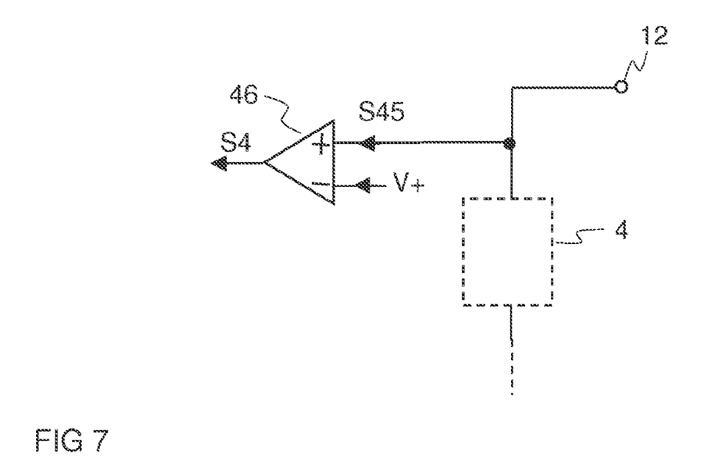
FIG. 7 shows an example of a circuit arrangement for detecting a voltage limiting state.

FIG. 7 shows an example of a circuit arrangement for generating a voltage limiting signal S4. This circuit arrangement evaluates the electrical potential at the circuit node common to the load Z and the transistor 1 in order to detect the voltage limiting mode of the transistor 1. For the low-side switch shown in FIG. 1, this circuit node is the first load-path terminal 12 of the semiconductor switching element 1. If, for a low-side switch (as shown in FIG. 1), this electrical potential rises above the positive supply potential, then the voltage limiting circuit 4 is enabled or the transistor is in avalanche mode. If, for a high-side switch (not shown), this electrical potential falls below the negative supply potential, then the voltage limiting circuit 3 is enabled or the transistor is in avalanche mode.

The circuit arrangement shown in FIG. 7 comprises a comparator 44, which compares the electrical potential at the circuit node 12 with the reference potential, which is the positive supply potential in the example shown. The voltage limiting signal S4 is provided at the output of this comparator.

The overload detector 3 shown in FIG. 6 exploits the fact that in avalanche mode or when using a voltage limiting circuit 4, the voltage across the load path is approximately constant when a load current I1 is flowing. The current flowing here, which for commutation of an inductive load is greatest at the beginning of the turn-off commutation, hence provides a measure of the electrical energy stored in the load that is to be converted into heat in the transistor 1 during the turn-off commutation.

In a further example it is provided to measure the time period during which a load current I1 flows through the transistor 1 during the OFF state. If this time period or turn-off commutation period is greater than a defined time period then an overload is assumed.

Figure 8:
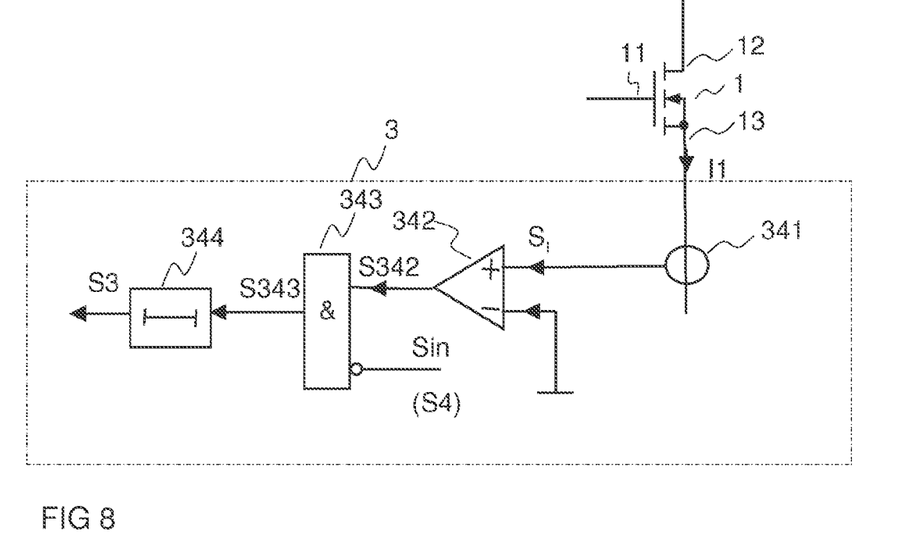
FIG. 8 shows another example of an overload detector of the drive circuit.

FIG. 8 shows an example of an overload detector having this functionality. This overload detector 3 comprises a current detector, which generates a detection signal S342, whose signal level depends on whether a load current I1 is flowing that is greater than a defined threshold value, for instance zero. In the example, this current detector comprises a current sensor 341, which is designed to generate a current signal or current measuring signal $S_I$ that represents a load current I1 flowing through the load path of the transistor 1. This current sensor may be any current sensor suitable for this purpose.

The current signal $S_I$ and a reference signal $S_{Iref}$, in the example zero, are input to a comparator 342, which compares these two values and which has an output at which the detection signal S342 is provided. This detection signal S342 assumes a first signal level, referred to below as the current-flow level, if a load current is detected.

The detection signal S342 is taken to an input of an AND gate 343, to whose other input is supplied the inverted switching signal Sin or alternatively the voltage limiting signal S4 (not shown). The overload detector shown is designed to generate an overload level of the overload signal S3 when, during the OFF state 101 (indicated by the inverted switching signal Sin or the voltage limiting signal S4), the detection signal S342 assumes a current-flow level for longer than a defined time period. In the example shown, the overload signal S3 is provided at the output of a delay element 344, to which is input the output signal S343 from the AND gate 343. This delay element 344 is an asymmetric delay element, which is designed to pass with a delay that edge of the output signal S343 from the AND gate that indicates a load current flowing during the OFF state. The delay equals the aforementioned defined time period. An edge of the output signal S343 from the AND gate that indicates an end of the OFF state 101 or a fall in the load current I1 to zero, on the other hand, is passed without a delay.

It should be mentioned that for the overload detector 3 shown in FIG. 8, any other time measuring arrangements can obviously be used that are suitable for measuring the time period during which a load current is flowing in the OFF state. Moreover, it should be mentioned that the overload detectors 3 described above can obviously be implemented using both analogue and digital circuit components.

The criteria described above that must be satisfied in order to assume the existence of an overload can obviously be combined or linked together, for example by only generating an overload level of the overload signal S3 when two or more of the aforementioned criteria are satisfied. To do this, the output signals of two or more of the overload detectors 3 described above can be combined using an AND gate, for example.

It is provided in an example of the drive circuit 10 that the drive circuit 10 only goes into the overload protection state 103 from an operating state in which the transistor 1 is in the voltage limiting mode. Such an operating state, in which the transistor 1 is in the avalanche operating state, for example, or in which the voltage limiting circuit 4 is enabled, is referred to below as the voltage limiting state 104.

Figure 9:
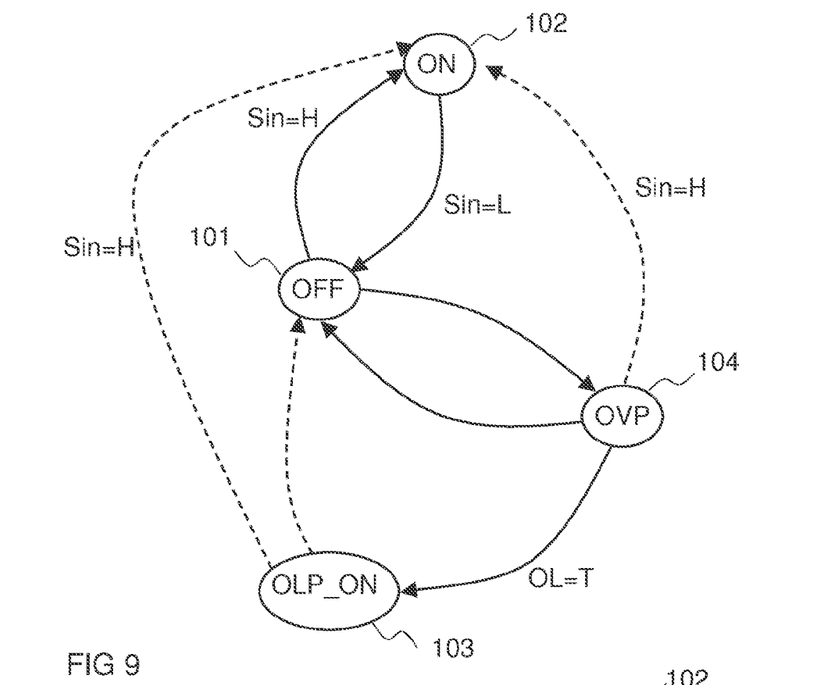
FIG. 9 uses a state diagram to show another example of the drive circuit.

FIG. 9 shows a state diagram for such a drive circuit 10, in which a change into the first over-temperature protection state 103 can only take place from a voltage limiting state 104. The drive circuit 10 goes into the voltage limiting state 104, for example, when a load current is flowing in the OFF state 101. The drive circuit can also go into the voltage limiting state, for example, when, for a low-side switch, the electrical potential at one of the load-path terminals of the transistor exceeds the electrical potential at the supply terminal to which the transistor is connected via the load, or when, for a high-side switch, the electrical potential at one of the load-path terminals of the transistor goes below the electrical potential at the supply terminal to which the transistor is connected via the load.

A return from the voltage limiting state 104 to the OFF state can take place, for example, when the voltage limiting mode of the transistor 1 ends without an overload having been detected.

Referring to FIG. 9, a change from the voltage limiting state 104 into the overload protection state 103 takes place if an overload OL is detected. This functionality of a change into the overload protection state 103 only taking place from the voltage limiting state 104 is guaranteed directly when using the overload detectors shown in FIGS. 6 and 8. These overload detectors 3 generate an overload level of the overload signal S3 only during the voltage limiting state.

For the overload detectors 3 described with reference to FIGS. 4 and 5, such a functionality can be achieved by taking the output signal from the comparators (313 in FIGS. 4 and 324 in FIG. 5) to an input of an optional AND gate (314 in FIGS. 4 and 325 in FIG. 5), to whose other input is fed the inverted switching signal Sin or the voltage limiting signal S4, and at whose output the overload signal S3 is provided. This AND gate 314 or 325 is shown dashed in FIGS. 4 and 5.

A drive circuit 10, which can only go into the overload protection state 103 from the voltage limiting state 104, guarantees that the transistor 1 is not also driven in the ON state when it is in the OFF state if the overload is detected from the temperature and if its temperature is made to rise by external influences up to the value of a temperature threshold value Tref1. Such external influences, for example, are faulty circuit components (not shown) arranged in the vicinity of the transistor 1.

To illustrate how the drive circuit described above works, FIG. 10 uses time waveforms of the switching signal Sin, the load-path voltage V1, the temperature T of the transistor 1 and the load current I1, for the case that an overload is detected from the temperature T of the transistor 1. It should be assumed for the explanation that the switching signal Sin initially has an ON level, in the example a high-level, and at a time t1 changes from the ON level to an OFF level, in the example a low level. The transistor 1 is driven in the fully ON state up to this time t1. During this operating state, approximately the entire supply voltage provided between the supply-voltage terminals lies across the load Z, says that the load-path voltage V1 is correspondingly small. The load current I1 is correspondingly large in this case.

Figure 10:
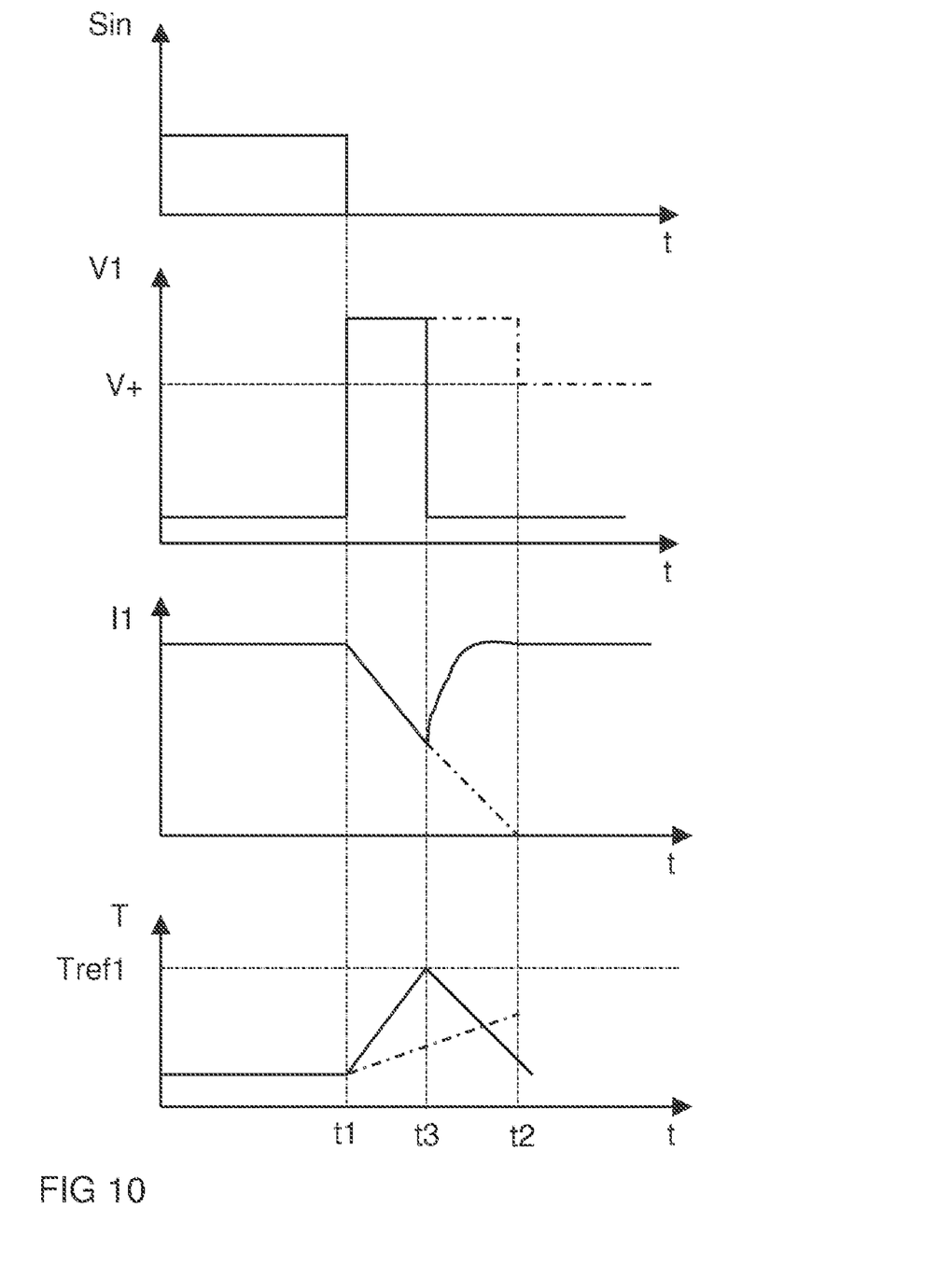
FIG. 10 uses signal time waveforms to show how an example of the drive circuit works.

At time t1 there is a step-change rise in the load-path voltage V1. For explanatory purposes it should be assumed that the load driven by the transistor 1 is an inductive load. In this case, the load-path voltage V1 must increase to a value that is greater than the supply voltage, i.e. the upper supply potential V+. At this point in time, the transistor 1 goes into avalanche mode or an optionally present voltage limiting circuit 4 is enabled. This limits any further increase in the load-path voltage V1. The load current I1 starts to drop from this point in time.

FIG. 10 shows two different scenarios: a first scenario, for which the signal waveforms are shown as dash-and-dot lines and in which the temperature T of the transistor does increase during the turn-off commutation phase, but not above the first temperature threshold Tref1; and a second scenario, for which the signal waveforms are shown as a continuous line and in which the temperature T rises above the first temperature threshold Tref1 during the turn-off commutation phase. In the first scenario, the inductive load commutates fully at turn-off. In this case, at a time t2, the load current I1 has dropped to zero and the load-path voltage V1 to the value of the supply voltage V+. In the second scenario, at a time t3 at which the temperature T exceeds the first temperature threshold value Tref1, the transistor 1 is driven in the fully ON state, causing the load-path voltage V1 to drop and the load current I1 to rise. This limits any further rise in the temperature T.

Figure 11:
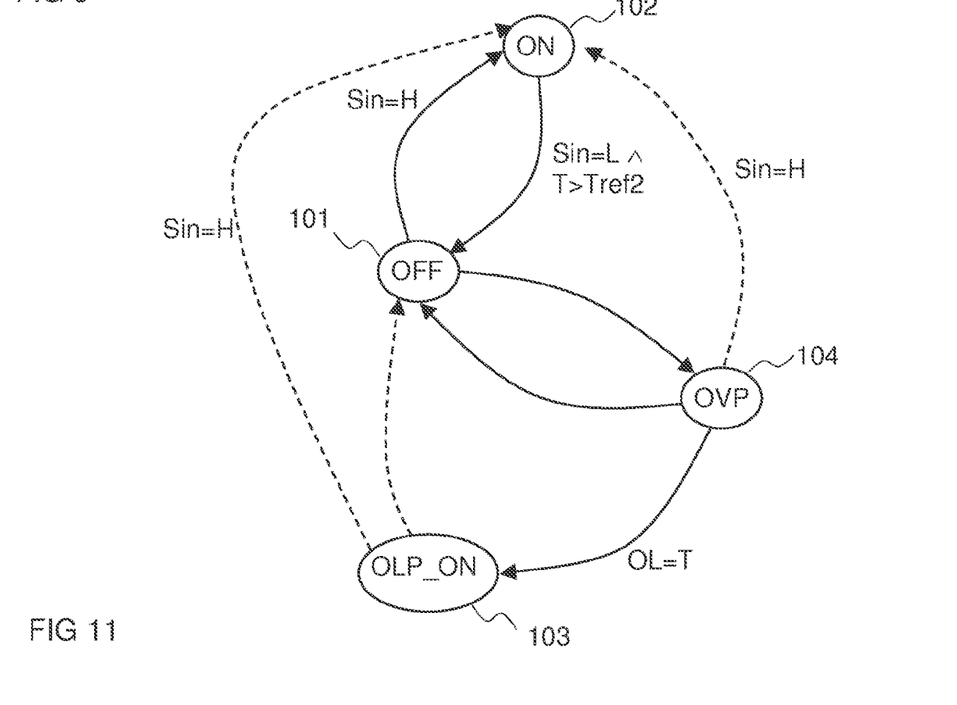
FIG. 11 uses a state diagram to show how another example of the drive circuit works.

FIG. 11 uses a state diagram to illustrate another drive circuit 10. This drive circuit differs from the drive circuit whose state diagram was explained with reference to FIG. 9 in that a change of state from the ON state 102 into the OFF state 101 does not just take place as a function of the switching signal Sin, but also occurs when the temperature T in the vicinity of the transistor 1 exceeds a temperature threshold value Tref2, which is lower than the temperature threshold value Tref1 when using the overload detector 3 shown in FIG. 4. Switching off the transistor 1 when this second temperature threshold value Tref2 is exceeded is intended to protect the transistor from damage or destruction. The drive circuit can be designed to return automatically to the ON state when the temperature drops below the second threshold value. To avoid oscillatory behavior, in particular there is the option of providing hysteresis for the change into the temperature-induced OFF state and the return to the ON state.

As shown in the state diagram, the circuit arrangement can go directly from the OFF state 101 into the voltage limiting state 104 if a load current is flowing during the OFF state, i.e. if the load is an inductive load, for example.

Considering the state diagrams described previously and still to be described below, the drive-signal generating circuit 2 can be implemented as a combinational logic circuit in any technology so there is no need to provide any further details on this.

Figure 12:
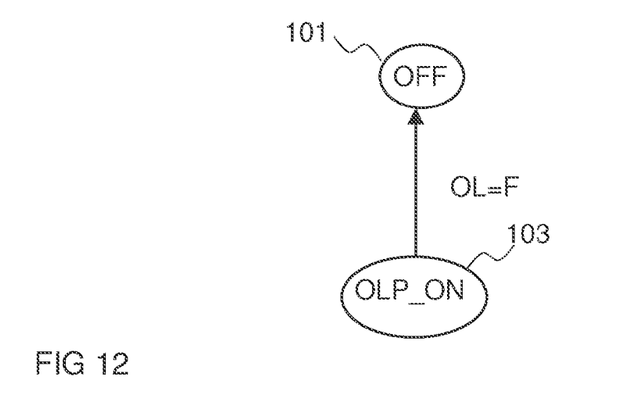
FIG. 12 uses a state diagram to show a first example of a change in state from an overload protection state into an OFF state.

The drive circuit 10 can be implemented so that it goes from the overload protection state 103 into the OFF state 101 as soon as an overload no longer exists. FIG. 12 shows an extract from a state diagram in which these operating states and the described change in state are shown. OL=F represents in this context the situation that a previously detected overload no longer exists, for instance the temperature has fallen below the defined reference value Tref1.

Figure 13:
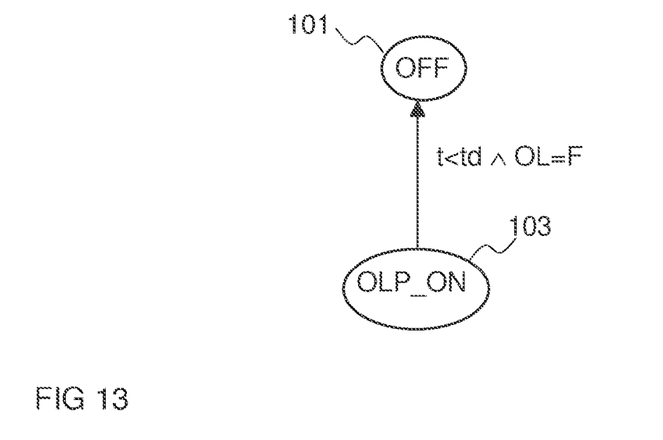
FIG. 13 uses a state diagram to show a second example of a change in state from an overload protection state into an OFF state.

Referring to FIG. 13, in another example it is provided that a change in state from the overload protection state 103 into the OFF state 101 occurs when the switching signal Sin assumes an OFF level and when a defined time interval td has passed after a change into the overload protection state 103.

A change from the overload protection state into the ON state 102 can take place directly, in a manner that is not shown further, when the switching signal Sin assumes an ON level.

Figure 14:
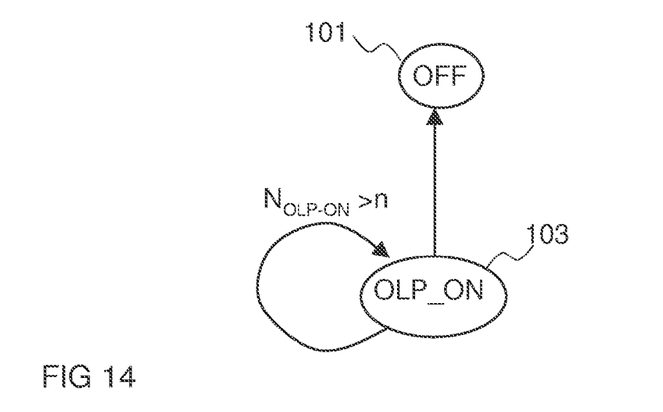
FIG. 14 uses a state diagram to show another example of a change in state from an overload protection state into an OFF state.

In a further example, for which the state diagram is shown in FIG. 14, it is provided to count a number $N_{OLP\text{-}ON}$ of changes in state into the overload protection state 103, and to leave the drive circuit 10 permanently in this overload protection state 103 if this number $N_{OLP\text{-}ON}$ has reached a defined value n. If this number is less than the defined number n, then a change from the over-temperature protection state 103 into the OFF state 101 can take place depending on one of the criteria described above with reference to FIGS. 12 and 13. In particular, n can be 1. In this case, the drive circuit 10 remains permanently in the over-temperature protection state once this has been reached.

The variants described with reference to FIGS. 12 to 14 apply irrespective of the manner in which the overload protection state 103 is reached, i.e. irrespective of whether a change into the over-temperature protection state 103 takes place only from the voltage limiting state 104 or also from one of the other states.

In a further example, the drive circuit 10 has a reset input for supplying a reset signal (RS in FIG. 1). This reset input can be used to reset the drive-signal generating circuit 2 to the OFF state 101 if it is in the overload protection state 103. The drive circuit 10 can also have a status output, via which a status signal ST can be output that signals whether the drive circuit 10 is in the overload protection state.

This status signal ST can be input to an evaluation circuit (not shown), which is designed, for example, to generate the reset signal once a defined time period has elapsed after the status signal has indicated an overload protection state. This allows another check to be made after this time has elapsed as to whether an overload still exists. This evaluation circuit is a microcontroller, for example, where the function of the evaluation circuit and the drive-signal generating circuit 2 can be implemented by a single microcontroller.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A drive circuit for a transistor, the drive circuit comprising:
    an output for providing a drive signal to the transistor;
    wherein the drive circuit
        monitors the transistor for an occurrence of an overload,
        changes into a voltage limiting state in which a voltage of the transistor is limited,
        changes into an overload protection state in which the drive circuit drives the transistor in an ON state upon detection of the overload of the transistor,
        assumes the overload protection state on the basis of whether, during the voltage limiting state, a current flowing through the transistor is greater than a current threshold value, and
        changes into the overload protection state only from the voltage limiting state.

2. The drive circuit according to claim 1, wherein the drive circuit assumes the overload protection state on the basis of whether a temperature of the transistor exceeds a defined temperature threshold value.

3. The drive circuit according to claim 1, wherein the drive circuit assumes the overload protection state on the basis of whether an electrical power converted into heat in the transistor during a defined time window exceeds a defined energy threshold.

4. The drive circuit according to claim 1, further comprising an input for receiving a switching signal, wherein the drive circuit operates in the voltage limiting state as a function of the switching signal.

5. The drive circuit according to claim 1, wherein the drive circuit assumes the overload protection state on the basis of whether, during the voltage limiting state, a current flowing through the transistor flows for longer than a defined time period.

6. The drive circuit according to claim 1, further comprising a voltage limiting circuit coupled between a load-path terminal and a drive terminal of the transistor.

7. The drive circuit according to claim 1, wherein the drive circuit changes into the voltage limiting state when the transistor is in an avalanche operating mode.

8. The drive circuit according to claim 1, further comprising an input for receiving a switching signal, wherein the drive circuit assumes an ON state in which it drives the transistor in the ON state if the switching signal assumes an ON level.

9. The drive circuit according to claim 1, further comprising a reset input for receiving a reset signal, wherein the drive circuit leaves the overload protection state when the reset signal has a reset level.

10. The drive circuit according to claim 9, wherein the drive circuit further leaves the overload protection state when receiving the reset signal even if the drive circuit was permanently remaining in the overload protection state.

11. The drive circuit according to claim 1, wherein the drive circuit leaves the overload protection state after a delay has elapsed.

12. The drive circuit according to claim 1, wherein the drive circuit counts changes into the overload protection state and to remain permanently in the overload protection state if a threshold number of changes into the overload protection state is reached.

13. The drive circuit according to claim 1, wherein the drive circuit assumes an OFF state if a temperature in the vicinity of the transistor exceeds a defined second temperature threshold value.

14. A method for driving a transistor that has a load path and a drive terminal, the method comprising:
operating the transistor in a voltage limiting state, wherein a voltage of the transistor is limited;
detecting an overload of the transistor;
operating the transistor in an overload protection state in which the transistor is driven in an ON state if an overload is detected, wherein a transition to the overload protection state occurs only if the transistor is being operated in the voltage limiting state; and
counting changes into the overload protection state, and permanently operating the transistor in the overload protection state if a threshold number of changes into a first over-temperature protection state is reached.

15. The method according to claim 14, further comprising: operating the transistor in the voltage limiting state in which a load-path voltage lying across the load path is limited if the load-path voltage rises to a load-path threshold value.

16. The method according to claim 15, wherein the load-path threshold value is an avalanche breakdown voltage of the transistor.

17. The method according to claim 15, wherein the load-path threshold value is set by a voltage limiting circuit connected to the load path of the transistor.

18. The method according to claim 14, further comprising:
receiving a switching signal, which can assume an ON level or an OFF level; and
operating the transistor in an ON mode in which the transistor is driven in an ON state if the switching signal assumes an ON level.

19. The method according to claim 14, further comprising ending the overload protection state after a delay has elapsed.

20. The method according to claim 14, further comprising ceasing permanently operating the transistor in the overload protection state upon receiving a reset signal.

21. A method for driving a transistor that has a load path and a drive terminal, the method comprising:
operating the transistor in a voltage limiting state, wherein a voltage of the transistor is limited;
detecting an overload of the transistor; and
operating the transistor in an overload protection state in which the transistor is driven in an ON state if an overload is detected, wherein a transition to the overload protection state occurs only if the transistor is being operated in the voltage limiting state, wherein the transistor is driven in the ON state if a temperature in the vicinity of the transistor exceeds a defined second temperature threshold value that is lower than a first temperature threshold value.

22. A drive circuit for a transistor, the drive circuit comprising:
an output for providing a drive signal to the transistor;
wherein the drive circuit
monitors the transistor for an occurrence of an overload,
changes into a voltage limiting state in which a voltage of the transistor is limited,
changes into an overload protection state in which the drive circuit drives the transistor in an ON state upon detection of the overload of the transistor,
assumes the overload protection state on the basis of whether, during the voltage limiting state, a current flowing through the transistor flows for longer than a defined time period, and
changes into the overload protection state only from the voltage limiting state.

* * * * *